United States Patent [19]

Bratt et al.

[11] 4,294,533
[45] Oct. 13, 1981

[54] APPARATUS FOR PRE-CONDITIONING FILM

[75] Inventors: Martin D. Bratt, Old Bridge; John F. Oakley, Parlin, both of N.J.

[73] Assignee: E. I. Du Pont de Nemours and Company, Wilmington, Del.

[21] Appl. No.: 63,471

[22] Filed: Aug. 3, 1979

Related U.S. Application Data

[62] Division of Ser. No. 889,420, Mar. 23, 1978, abandoned.

[51] Int. Cl.³ .............................................. G03D 5/06
[52] U.S. Cl. .................................. 354/318; 354/325; 15/102; 118/73; 118/259
[58] Field of Search ............... 354/317, 318, 319, 325; 430/273, 275, 309; 15/77, 102; 134/64 P, 122 P; 355/30; 118/72, 73, 249, 259, 110

[56] References Cited

U.S. PATENT DOCUMENTS

| | | |
|---|---|---|
| 2,158,817 | 5/1939 | Doetzel . |
| 2,305,011 | 12/1942 | Kienninger . |
| 2,336,875 | 12/1943 | MacDonald et al. ............... 354/318 |
| 2,355,109 | 8/1944 | Riddick . |
| 2,386,856 | 10/1945 | Houston . |
| 3,093,052 | 6/1963 | Burner . |
| 3,104,603 | 9/1963 | Schwienbacher ................... 354/318 |
| 3,129,096 | 4/1964 | Collinson et al. . |
| 3,169,066 | 2/1965 | Hoerner .............................. 430/309 |
| 3,299,791 | 1/1967 | Fukuda ............................... 354/318 |
| 3,358,642 | 12/1967 | Beck et al. . |
| 3,443,950 | 5/1969 | Rawlins . |
| 3,448,720 | 6/1969 | Graham ............................... 118/110 |
| 3,458,311 | 7/1969 | Alles .................................... 430/273 |
| 3,505,701 | 4/1970 | Keil ..................................... 15/102 |
| 3,625,131 | 12/1971 | Puls ..................................... 354/318 |
| 3,629,036 | 12/1971 | Isaacson . |
| 3,630,776 | 12/1971 | Barr . |
| 3,635,762 | 1/1972 | Ott ....................................... 355/30 |
| 3,682,079 | 8/1972 | Casson ................................ 354/318 |
| 3,694,071 | 9/1972 | Touchette . |
| 3,753,419 | 8/1973 | Fukushima . |
| 3,837,860 | 9/1974 | Roos . |
| 3,895,949 | 7/1975 | Akamatsu ........................... 430/275 |
| 3,995,343 | 12/1976 | Horner . |
| 3,995,585 | 12/1976 | Schuurmans ....................... 354/318 |
| 3,999,511 | 12/1976 | Schwandt et al. ................. 354/318 |
| 4,029,505 | 6/1977 | Nebe . |
| 4,034,389 | 7/1977 | Huss .................................... 354/322 |
| 4,142,194 | 2/1979 | Hamlin ............................... 354/325 |
| 4,173,673 | 11/1979 | Bratt . |

FOREIGN PATENT DOCUMENTS

| | | |
|---|---|---|
| 692000 | 11/1930 | France . |
| 1370612 | 7/1964 | France . |
| 556631 | 10/1943 | United Kingdom . |

*Primary Examiner*—L. T. Hix
*Assistant Examiner*—Alan Mathews

[57] ABSTRACT

An apparatus for removing dirt from an exposed film as it is advanced to an image developing unit includes a scrub roll with a spongy surface and a second roll in engagement therewith for transporting the film. A conduit with perforations directed at the scrub roll is positioned thereabove and is connected to a source of flushing liquid. The transport and scrub rolls are driven co-currently at different surface speeds to generate a scrubbing, shearing action along with simultaneous wetting of the film surface to remove most of any dust or dirt previously carried by or embedded in the surface of the film.

6 Claims, 2 Drawing Figures

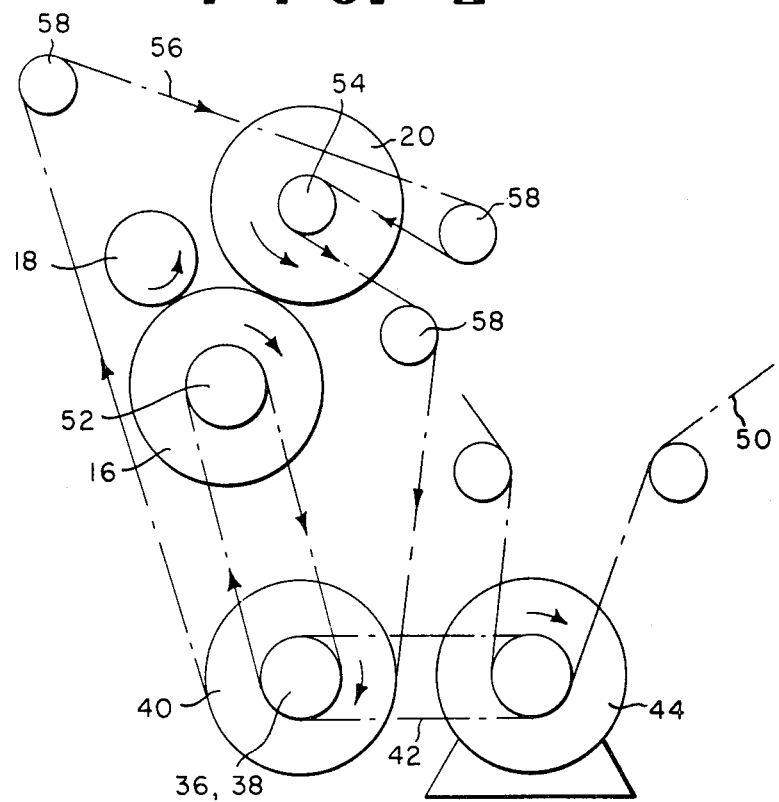

APPARATUS FOR PRE-CONDITIONING FILM

This is a division of application Ser. No. 889,420 filed Mar. 23, 1978, now abandoned.

TECHNICAL FIELD

This invention relates generally to the processing of lithographic film and, more particularly, to a pre-conditioning of such film before its development.

BACKGROUND

In the graphic arts industry, and particularly in lithography, printing plates are usually imaged by exposing them through a film containing a line or half-tone image. At the outset, the original material or "copy" may be in the form of a continuous tone photograph, drawing or type proof. This is then reduced to a black and white transparency of the correct size using a camera or scanner and, during this step, continuous tone images may be converted to half-tone. This transparency, however, is seldom in a form suitable for the exposure of a plate and a contact or first generation copy is made, for example, to combine line and half-tone films in register, to produce a single film from stripped flats, to strengthen half-tone dots or to make spreads or chokes. The first generation copy may then be printed on another film in contact to give a second generation copy, and this even to a third generation before a film suitable for use in plate exposure is obtained.

In the contact printing operation, a target film is placed over a sheet of unexposed film in a vacuum frame. After vacuum has been applied and the films are in good contact, the film is exposed and then processed. Contact printing is usually carried out with silver halide films that can be either negative or positive working. However, photosensitive films, either photohardenable or photosolubilizable, can also be used. They consist typically of a transparent polyethylene terephthalate support, on one side of which is an opaque photosensitive layer covered by a thin oxygen impermeable barrier layer. Actinic light forms relatively soluble and insoluble regions in the photosensitive layer and the soluble regions can then be washed out in a suitable solvent to leave a relief image of the target. It was found in practice that the use of such films often results in an unacceptably high level of pin holes in opaque areas of copies which resulted from residual opaque specks in supposedly clear areas of the preceding generation.

Pinholes in opaque areas result from dirt carried by or pressed into the surface of soluble regions of the preceding generation, for example, during vacuum draw down. Such dirt can retard the penetration of developer in its immediate area and result in a residual speck of underdeveloped photosensitive material which will copy as a pinhole.

DISCLOSURE OF INVENTION

The number of defects in developed films has been reduced to acceptable levels by placing a pre-conditioner in the path of exposed film being advanced to a developing unit. The pre-conditioner has a scrub roll with a spongy surface and a second roll in engagement with the scrub roll for transporting the film. A conduit with perforations directed at the scrub roll is positioned near it and connected to a source of flushing liquid. The transport and scrub rolls are driven co-current at different surface speeds.

DESCRIPTION OF DRAWINGS

FIG. 2 is a schematic illustration of the drive system associated with the driven rolls of FIG. 1.

DESCRIPTION OF APPARATUS

Figure 1:
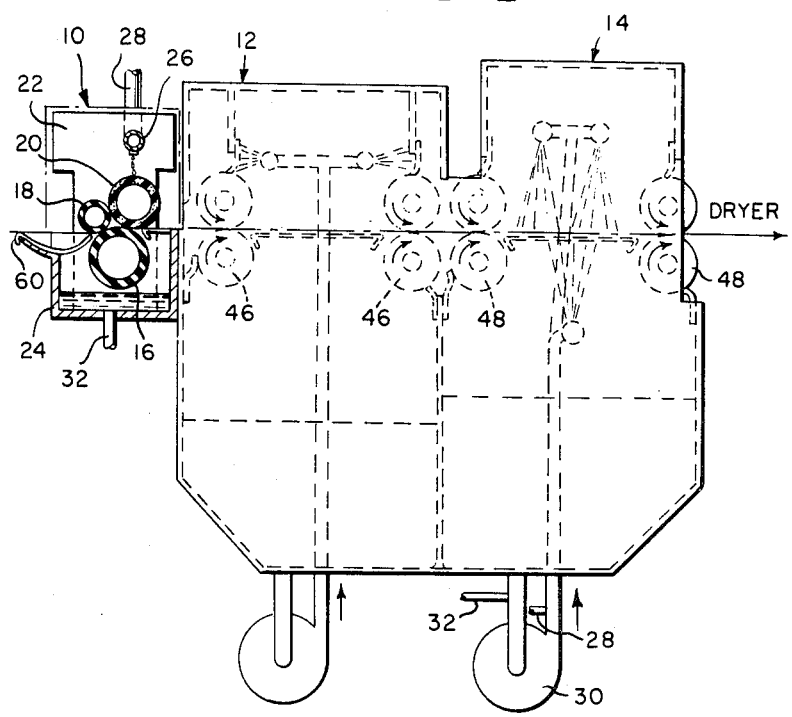
FIG. 1 is a side elevation of an apparatus for developing film, parts having been shown in section to reveal constructional details of the pre-conditioner.

The illustrated apparatus has a pre-conditioner unit 10 attached to a developing unit 12 which, in turn, is connected to a rinsing unit 14. After development, a rinsed film is fed through a dryer. Details of the units 12,14 and their operation have been described by Hamlin in Unit 10 includes a transport roll 16 and a surface driven pinch roll 18 between which a film with an exposed upper surface is fed to the nip between roll 16 and a scrub roll 20. Rolls 16, 18, 20 are journalled in upright plates 22 located at the ends of a pan 24. Rolls 16, 18 are covered with hard layers of a synthetic rubber and roll 20 with a layer of spongy material such as foam rubber or polyurethane.

Above scrub roll 20, there is a conduit 26 connected through a hose 28 to the outlet of a pump 30 that circulates rinse water to unit 14. In the bottom of conduit 26, there is a line of perforations through which water drips to the spongy surface of scrub roll 20. Water from pan 24 is recirculated through a hose 32 to the suction side of pump 30. Flushing liquids other than water may be used if they are miscible with the developing solvent but incapable of dissolving any portion of the photosensitive layer. Furthermore, the flushing liquid can be recirculated through hoses and pumps that are independent of the units 12,14.

As shown in FIG. 2, the drive system for pre-conditioner 10 includes interconnected sprocket wheels 36,38,40. Sprocket wheel 36 is driven through a chain 42 by a motor 44. Motor 44 is coupled to feed rolls 46,48 (FIG. 1) for developing and rinsing units 12,14 through a chain 50. Sprocket wheel 38 has the same number of teeth as a sprocket wheel 52 that is connected to transport roll 16. Wheel 38 drives roll 16 at process speed, i.e., the surface speed of roll 16 is the same as the surface speed of feed rolls 46,48. Sprocket wheel 40 is coupled to a sprocket wheel 54 through a chain 56 that also passes over idler sprockets 58. Wheel 54 is connected to scrub roll 20 and has substantially fewer teeth than wheel 40, i.e., the surface speed of scrub roll 20 exceeds process speed.

In operation, an exposed film that has a photosensitive layer on a support is placed on a tray 60 of spaced wires and inserted into unit 10. The leading edge of tray 60 is directed downwardly and the trailing edge is bent upwardly toward the nip between rolls 16,18. This configuration of the tray directs an inserted film to rolls 16,18 and the latter advance the film past scrub roll 20 and another wire tray to the feed rolls 46 in developing unit 12. Thereafter, the film advances in a straight line path through units 12,14 and the associated dryer.

In unit 10, flushing liquid drips from conduit 26 onto the spongy surface of scrub roll 20. Liquid squeezed from roll 20 floods the upper surface of the film. As noted, the surface speed of roll 20 exceeds that of roll 16. Thus, roll 20 moves co-current with respect to roll 16 and the advancing film. Such relative movement yields a scrubbing and shearing action simultaneously with the flooding of the film surface. The flushing liquid displaces and flushes dirt which would retard penetration of the photosensitive layer by the developer solution or solvent.

Where the term "dirt" is used herein, it refers to any foreign matter that retards or interferes with development and includes materials that are transparent or opaque to actinic radiation and soluble or insoluble in the processing liquids.

A developing solution is distributed over the surface of the film in unit 12 and rinse water is sprayed on the developed film in unit 14. These liquids and the mechanical spray action in unit 14 soften and permit removal of the soluble regions of the film.

Where used herein, the term "photosensitive layer" applies to a layer of either a positive or negative working photohardenable or photosolubilizable composition. A photohardenable composition is one that becomes insoluble in regions exposed to actinic radiation and remains soluble in unexposed regions, thus providing a negative working system. Typical photohardenable compositions have been disclosed in the U.S. Pat. No. 4,173,673 to Bratt et al. A positive working photohardenable composition that is photopolymerizable and comprises a compound containing a dinitroso group which is a non-inhibitor of free radical polymerization and is photochemically converted by untraviolet (UV) radiation (2000–3800 A) to an inhibitor of free radical polymerization has been disclosed by Nebe in U.S. Pat. No. 4,029,505. The regions imagewise exposed to UV radiation (2000–3800 A) remain soluble, whereas the regions originally unexposed become insoluble when exposed to actinic radiation (>3800 A) that activates the free radical generating system but does not convert the nitroso compound to an inhibitor of free radical polymerization. A photosolubilizable composition is one that becomes soluble in exposed regions and remains insoluble in unexposed regions, thus providing a positive working system. Typical photosolubilizable compositions have been disclosed by Roos in U.S. Pat. No. 3,837,860.

Referring to the drawings, the surface of roll 16 contacted by the exposed film presents a pre-conditioning zone in which the film is flooded with flushing liquid squeezed from the spongy surface of roll 20 and scrubbed by the co-current, shearing movement of roll 20 relative to the film. The transport speed of the film is governed by the surface speed of roll 16. The scrubbing, shearing action along with simultaneous flooding of the film surface with flushing liquid removes most of any dust or dirt previously carried by or embedded in the surface of the film. Where the film surface is provided with an overcoat on the photosensitive layer, the flushing liquid used is a solvent for the overcoat layer. Passage of film having an overcoat through the pre-conditioning cycle then results in removal of at least a partial thickness of the overcoat. This is the best mode contemplated by applicants. From the pre-conditioning zone, the film is advanced through developing and rinsing steps in units 12,14 to a dryer.

In the enclosure of unit 12, a developing solution or solvent for the soluble regions of the imagewise exposed film is pumped through spray bars onto the upper feed rolls and flows downwardly to and floods the scrubbed surface of the film. Flexible wipers engage the rolls to prevent escape of the developing solution to surfaces of the film other than the transient area between the inlet and outlet rolls 46. Thus, developing time is accurately controlled by and dependent on process speed. The developing solution softens and thereby facilitates removal of residual overcoat and soluble regions of the photosensitive layer.

From the developing step, the film advances to and through the rinsing step in the enclosure for unit 14 to a dryer. In the rinsing step, any softened or loose material resulting from the developer action is dislodged and flushed from the film.

An apparatus of the type shown in the drawings was used in comparative tests. In these tests, the surface speed of scrub roll 20 was five times the surface speed of transport roll 16. The developing agent was an aqueous solution of an alkali carbonate and a bicarbonate having a pH of about 11.

Lithographic film was prepared for the tests by coating a 0.004 inch (0.101 mm) thick film or base of polyethylene terephthalate with a subbing layer, a 0.0002 inch (0.005 mm) thick negative working photohardenable layer and an overcoat layer. The subbing layer is a polymer layer chosen to provide adhesion between the base and the photohardenable layer. The photohardenable layer, which is insoluble in water, can be developed with aqueous alkali, no organic solvent being necessary. It contains dispersed carbon black and has an optical density greater than 3.0 in the 300–500 nanometer (nm) region. The overcoat solution was applied with a 0.002 inch (0.05 mm) doctor blade and had a formulation in grams as follows:

| | |
|---|---|
| polyvinyl alcohol | 2.25 |
| distilled water | 122.50 |
| polyoxyethylene surfactant | 0.45 |
| ethyl "Cellosolve" | 2.50 |
| ethyl alcohol | 2.50 |
| colloidal silica (30% soln.) | 2.70 |

The dried overcoat had a coating weight of 10.0 mg/dm$^2$ and was soluble both in water and in the aqueous alkaline developing solution.

The overcoated test sample was drawn down in a standard (nuArc ®) vacuum frame for 5 minutes in emulsion-to-emulsion contact with a half-tone target bearing large opaque areas. The target was a silver image transparency with considerable room dirt on the emulsion side. The sample was then exposed through the target by a Sylvania BRH lamp (1000 watt, tungsten-iodide) for 20 seconds; the lamp was at a distance of 152.5 cm from the element. The exposed sample was cut in half. One half of the sample was processed in the developing apparatus shown in FIG. 1 at a film speed of 12 fpm (3.658 m/min.), while the other half of the sample was processed in the same apparatus, but with the pre-conditioner removed, at a film speed of 10 fpm (3.048 m/min.) to yield two first generation films. The dust speck defect is difficult to see at this point but is more apparent when seen as a pinhole in the next generation.

Another negative working film sample was then drawn down in emulsion-to-emulsion contact and exposed through the first generation films prepared above, the first generation films being placed side-by-side over the sample, using the draw down and exposure conditions described above. The sample was processed in the apparatus of FIG. 1 at a film speed of 12 fpm (3.658 m/min.) to yield a second generation film. The pinholes were counted in the opaque areas in 40 fields of view (approximately 1 square cm total) of a microscope having a magnification power of 100.

For the first generation film that was pre-conditioned, the second generation film had 15 pinholes. For the first generation film that was not pre-conditioned, the second generation film had 113 pinholes.

What is claimed as new and desired to be secured by Letters Patent is:

1. In an apparatus for developing film, a pre-conditioner comprising: a scrub roll; a second roll in engagement with the scrub roll for transporting a film to be developed therebetween; a conduit positioned above and provided with perforations directed at said scrub roll; a source of flushing liquid connected to said conduit; and drive means coupled to said rolls for their co-current rotation at different surface speeds.

2. The apparatus of claim 1 wherein said scrub roll is above the transporting roll and has a spongy surface.

3. The apparatus of claim 1 or claim 2 wherein is provided a pinch roll in engagement with and driven by said transporting roll for preventing relative movement of film with respect to the transporting roll.

4. In a processing apparatus including an enclosure for developing film, feed rolls for advancing film to and from the enclosure and drive means coupled to said feed rolls for their rotation at process speed, a pre-conditioner comprising: transport and scrub rolls positioned adjacent said enclosure; a conduit located above and provided with perforations directed at said scrub roll; and a source of flushing liquid connected to said conduit, said scrub roll being in engagement with said transport roll and coupled to said drive means for co-current rotation at a surface speed greater than transport speed, said transport roll being coupled to the drive means for rotation of its surface at process speed.

5. The apparatus of claim 4 wherein said scrub roll is above the transport roll and has a surface comprised of a layer of spongy material.

6. The apparatus of claim 4 or claim 5 wherein is provided a pinch roll acting in engagement with and driven by said transport roll to constrain forward movement of the film to the surface speed of the transport roll.

* * * * *